US012266537B2

(12) United States Patent
Shaw et al.

(10) Patent No.: US 12,266,537 B2
(45) Date of Patent: Apr. 1, 2025

(54) SELECTIVE BARRIER METAL ETCHING

(71) Applicant: Applied Materials, Inc., Santa Clara, CA (US)

(72) Inventors: Jonathan Shaw, Oakland, CA (US); Gene Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 547 days.

(21) Appl. No.: 17/592,365

(22) Filed: Feb. 3, 2022

(65) Prior Publication Data

US 2022/0285167 A1 Sep. 8, 2022

Related U.S. Application Data

(60) Provisional application No. 63/155,911, filed on Mar. 3, 2021.

(51) Int. Cl.
*H01L 21/311* (2006.01)
*H01J 37/32* (2006.01)
*H01L 21/768* (2006.01)

(52) U.S. Cl.
CPC ...... *H01L 21/31116* (2013.01); *H01J 37/321* (2013.01); *H01L 21/76849* (2013.01); *H01J 2237/334* (2013.01)

(58) Field of Classification Search
CPC .......... H01L 21/3065–30655; H01L 21/31116; H01L 21/67069; H01L 21/32136–32137; H01L 21/02071; H01L 21/76849; H01L 23/53252; H01L 21/76885; H01L 21/76862; H01L 21/28568; H01L 21/76816; H01L 21/02019; H01L 21/30604–30621; H01L 21/3063–30635; H01L 21/31055–31056; H01L 21/31111–31122; H01L 21/31133–31138; H01L 21/32133–32139; H01L 21/465; H01L 21/76841–76876; H01L 21/3003–3006; H01J 2237/334–3348; H01J 37/321; C23F 1/02–44
See application file for complete search history.

(56) References Cited

U.S. PATENT DOCUMENTS 6,169,009 B1 1/2001 Ju et al.
9,418,934 B1* 8/2016 Briggs .............. H01L 21/76847
2002/0192900 A1* 12/2002 Athavale .......... H01L 21/32136
438/243

(Continued)

FOREIGN PATENT DOCUMENTS

KR 10-2009-0022809 A 3/2009

OTHER PUBLICATIONS

International Search Report dated May 23, 2022 for Application No. PCT/US2022/015137.

*Primary Examiner* — Amar Movva
*Assistant Examiner* — Eric Manuel Mulero Flores
(74) *Attorney, Agent, or Firm* — Patterson + Sheridan, LLP

(57) ABSTRACT

A method for selective barrier metal etching includes performing a hydrogen implantation process, in an inductively coupled plasma (ICP) etch chamber, to chemically reduce an oxidized portion of a barrier metal layer formed within a feature in a metal layer on the barrier metal layer, and performing an etch process, in the ICP etch chamber, to remove the hydrogen implanted portion of the barrier metal layer.

15 Claims, 5 Drawing Sheets

(56) References Cited

U.S. PATENT DOCUMENTS

| | | |
|---|---|---|
| 2009/0239374 A1 | 9/2009 | Kim et al. |
| 2015/0262869 A1* | 9/2015 | Naik ................. H01L 21/32139 |
| | | 438/643 |
| 2017/0178927 A1 | 6/2017 | Biggs et al. |
| 2019/0093232 A1* | 3/2019 | Chatterjee ............... C23C 16/56 |
| 2020/0126996 A1 | 4/2020 | Panda et al. |
| 2021/0391296 A1* | 12/2021 | Yao ................... H01L 21/76802 |
| 2022/0359224 A1* | 11/2022 | Jiang ................ H01L 21/32139 |
| 2023/0110947 A1* | 4/2023 | Yamazaki ......... H01L 21/02433 |
| | | 118/724 |

* cited by examiner

SELECTIVE BARRIER METAL ETCHING

CROSS-REFERENCE TO RELATED APPLICATIONS

This application claims benefit of U.S. provisional patent application Ser. No. 63/155,911, filed Mar. 3, 2021, which is herein incorporated by reference.

BACKGROUND

Field

Examples of the present disclosure generally relate to methods for forming metal features in semiconductor structures. Particularly, embodiments of the present disclosure provide methods for etching a metal layer having a barrier metal layer formed thereunder.

Description of the Related Art

In semiconductor manufacturing, tungsten, cobalt, and copper have been implemented as contacts and interconnects in the backend-of-line (BEOL) and middle-of-the-line (MOL) structures used in memory devices, such as dynamic random-access memory (DRAM) devices. Tungsten, in particular, has been the most reliable metal due to the well-established method of a chemical vapor deposition (CVD) growth at low cost. However, as semiconductor devices become smaller at the sub 7 nm nodes and a line critical dimension (CD) reaches a few nanometers, contact resistance of tungsten having such a small line CD increases substantially. Cobalt may exhibit some reduction in line resistance as compared with tungsten, but the reduction may not be sufficient. Thus, ruthenium has become a strong candidate for replacing the existing materials for contacts and interconnects. Ruthenium has a low resistivity even for smaller pitches and smaller critical dimensions in the sub 7 nm nodes.

However, there is a complication in lithography-and-etch processes of ruthenium-based structures. A ruthenium layer is typically formed on a barrier metal layer, such as titanium (Ti), titanium nitride (TiN), tantalum (Ta), and/or tantalum nitride (TaN), to prevent diffusion of ruthenium into an underlying silicon-based substrate to form ruthenium silicate. When the ruthenium layer is etched using oxygen containing etching gas, the barrier metal layer is partially oxidized and is sputtered onto the ruthenium layer, which acts as a non-volatile etch stop layer. Thus, the ruthenium layer cannot be etched to a surface of the barrier metal layer to produce an etch profile as initially patterned.

Therefore, there is a need for a method for etching a metal layer formed of ruthenium on a barrier layer to provide a desired etch profile.

SUMMARY

Embodiments of the present disclosure provide a method for selective barrier metal etching. The method includes performing a hydrogen implantation process, in an inductively coupled plasma (ICP) etch chamber, to chemically reduce an oxidized portion of a barrier metal layer formed within a feature in a metal layer on the barrier metal layer, and performing an etch process, in the ICP etch chamber, to remove the hydrogen implanted portion of the barrier metal layer.

Embodiments of the present disclosure also provide a method for forming a metal containing feature. The method includes performing a first etch process, in an ICP etch chamber, to form a feature in a metal layer formed on a metal barrier layer, using an oxygen containing etching gas, performing a hydrogen implantation process, in the ICP etch chamber, to chemically reduce an oxidized portion of the barrier metal layer formed within the feature in the metal layer, and performing a second etch process, in the ICP etch chamber, to remove the hydrogen implanted portion of the barrier metal layer by using a chlorine containing etching gas.

Embodiments of the present disclosure further provide a metal containing structure. The metal containing structure includes a barrier metal layer formed on a substrate, a metal feature formed on the barrier metal layer, and a dielectric feature formed on the metal feature. The metal feature and the dielectric feature have a line critical dimension of between 3 nm and 90 nm.

BRIEF DESCRIPTION OF THE DRAWINGS

So that the manner in which the above recited features of embodiments of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The embodiments described herein provide methods for forming metal features in semiconductor structures. More particularly, embodiments of the present disclosure provide methods for etching a metal layer having a barrier metal layer formed under the metal layer. In the sub 7 nm node semiconductor processes, ruthenium (Ru) is a candidate metal for replacing conventionally used metal, such as tungsten, to form contacts and interconnects. However, a barrier layer that is disposed between a ruthenium-based structure and a substrate is not etched by oxygen containing etching gas that etches the ruthenium-based structure. Instead, a portion of the barrier layer is oxidized and sputtered onto the ruthenium-based structure, acting as an etch stop layer for the ruthenium-based structure. The methods provided herein remove the oxidized portion of the barrier metal layer by an atomic layer etching (ALE) technique, such that the ruthenium-based structure can be formed with a desired line CD.

Figure 1:
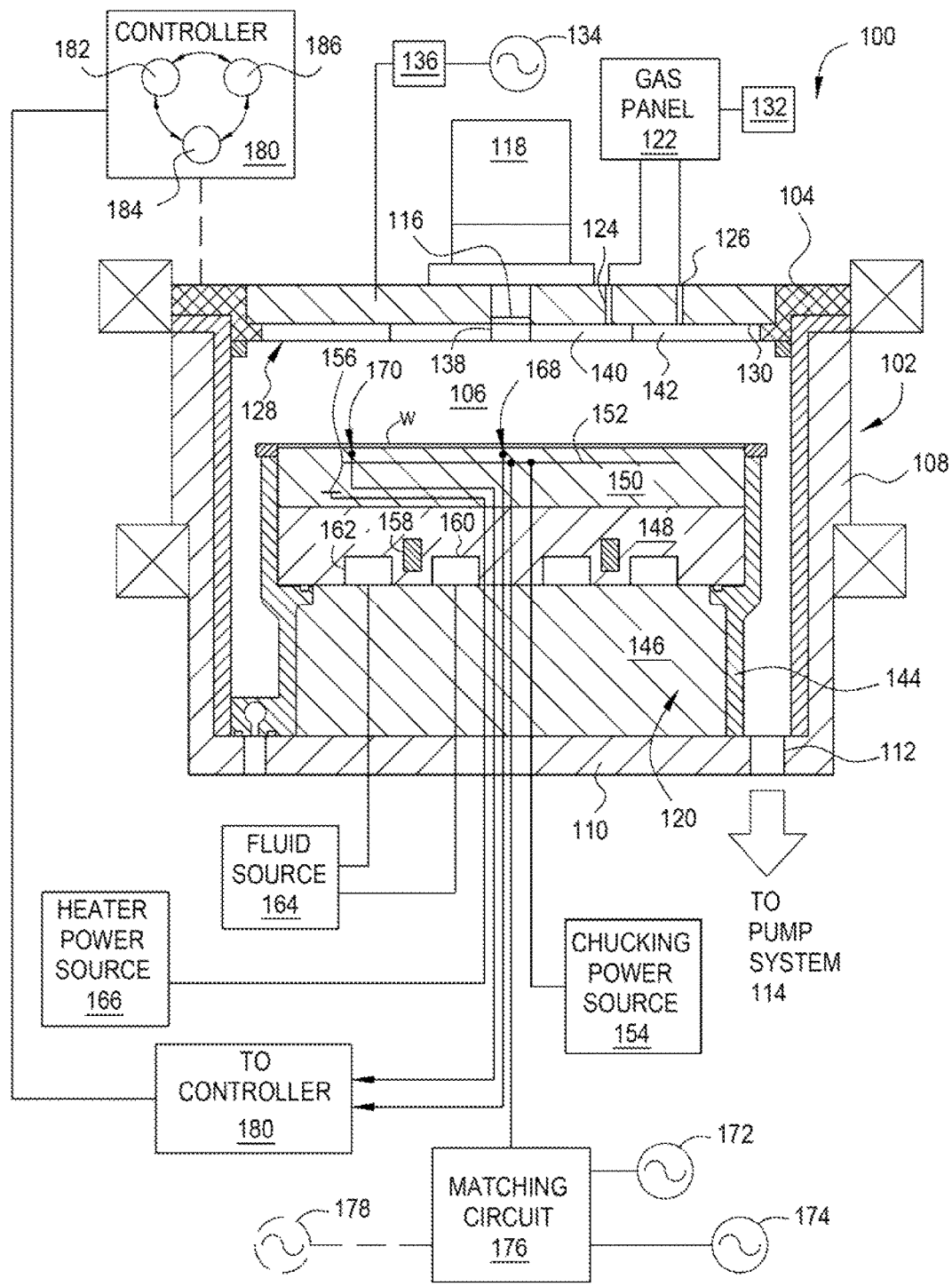
FIG. 1 depicts an inductively coupled plasma (ICP) etch chamber that may be utilized to perform a patterning process according to one embodiment.

FIG. 1 is a sectional view of one example of an inductively coupled plasma (ICP) etch chamber 100 suitable for performing an etching process. Suitable ICP etch chambers that may be adapted for use with the methods disclosed herein include inductively coupled plasma reactive ion etching (ICP-RIE) chambers, for example, a CENTRIS® SYM3™ etch chamber available from Applied Materials, Inc. of Santa Clara, California Although the ICP etch chamber 100 is shown including a plurality of features that enable superior etching performance, it is contemplated that other ICP etch chambers may be adapted to benefit from one or more of the inventive features disclosed herein.

The ICP etch chamber 100 includes a chamber body 102 and a lid 104 which enclose an interior volume 106. The chamber body 102 is typically fabricated from aluminum, stainless steel or other suitable material. The chamber body 102 generally includes sidewalls 108 and a bottom 110. A substrate support pedestal access port (not shown) is generally defined in a sidewall 108 and selectively sealed by a slit valve to facilitate entry and egress of a substrate W from the ICP etch chamber 100. An exhaust port 112 is defined in the chamber body 102 and couples the interior volume 106 to a vacuum pump system 114. The vacuum pump system 114 generally includes one or more pumps and throttle valves utilized to evacuate and regulate the pressure of the interior volume 106 of the ICP etch chamber 100.

The lid 104 is sealingly supported on the sidewall 108 of the chamber body 102. The lid 104 may be opened to allow access to the interior volume 106 of the ICP etch chamber 100. The lid 104 includes a window 116 that facilitates optical process monitoring. In one implementation, the window 116 is comprised of quartz or other suitable material that is transmissive to a signal utilized by an optical monitoring system 118 mounted outside the ICP etch chamber 100.

The optical monitoring system 118 is positioned to view at least one of the interior volume 106 of the chamber body 102 and/or the substrate W positioned on a substrate support pedestal assembly 120 through the window 116. In one embodiment, the optical monitoring system 118 is coupled to the lid 104 and facilitates an integrated deposition process that uses optical metrology to provide information that enables process adjustment to compensate for incoming substrate pattern feature inconsistencies (such as thickness, and the like), and provide process state monitoring (such as plasma monitoring, temperature monitoring, and the like) as needed. One optical monitoring system that may be adapted to benefit from the disclosure is the EyeD® full-spectrum, interferometric metrology module, available from Applied Materials, Inc., of Santa Clara, California.

A gas panel 122 is coupled to the ICP etch chamber 100 to provide process and/or cleaning gases to the interior volume 106. In the example depicted in FIG. 1, inlet ports 124, 126 are provided in the lid 104 to allow gases to be delivered from the gas panel 122 to the interior volume 106 of the ICP etch chamber 100. In one implementation, the gas panel 122 is adapted to provide fluorinated process gas through the inlet ports 124, 126 and into the interior volume 106 of the ICP etch chamber 100.

A showerhead assembly 128 is coupled to an interior surface 130 of the lid 104. The showerhead assembly 128 includes a plurality of apertures that allow the gases to follow through the showerhead assembly 128 from the inlet ports 124, 126 into the interior volume 106 of the ICP etch chamber 100 in a predefined distribution across the surface of the substrate W being processed in the ICP etch chamber 100.

A remote plasma source 132 may be optionally coupled to the gas panel 122 to facilitate dissociating a gas mixture from a remote plasma prior to entering into the interior volume 106 for processing. An RF power source 134 is coupled through a matching network 136 to the showerhead assembly 128. The RF power source 134 typically is capable of producing up to about 3000 W at a tunable frequency in a range from about 50 kHz to about 200 MHz.

The showerhead assembly 128 additionally includes a region transmissive to an optical metrology signal. An optically transmissive region or passage 138 is suitable for allowing the optical monitoring system 118 to view the interior volume 106 and/or the substrate W positioned on the substrate support pedestal assembly 120. The passage 138 may be a material, an aperture or plurality of apertures formed or disposed in the showerhead assembly 128 that is substantially transmissive to the wavelengths of energy generated by, and reflected back to, the optical monitoring system 118.

In one implementation, the showerhead assembly 128 is configured with a plurality of zones that allow for separate control of gas flowing into the interior volume 106 of the ICP etch chamber 100. In the example illustrated in FIG. 1, the showerhead assembly 128 has an inner zone 140 and an outer zone 142 that are separately coupled to the gas panel 122 through separate inlet ports 124, 126.

The substrate support pedestal assembly 120 is disposed in the interior volume 106 of the ICP etch chamber 100 below the gas distribution (showerhead) assembly 128. The substrate support pedestal assembly 120 holds the substrate W during processing. The substrate support pedestal assembly 120 generally includes a plurality of lift pins (not shown) disposed therethrough that are configured to lift the substrate W from the substrate support pedestal assembly 120 and facilitate exchange of the substrate W with a robot (not shown) in a conventional manner. An inner liner 144 may closely circumscribe the periphery of the substrate support pedestal assembly 120.

In one implementation, the substrate support pedestal assembly 120 includes a mounting plate 146, a base 148 and an electrostatic chuck 150. The mounting plate 146 is coupled to the bottom 110 of the chamber body 102 and includes passages for routing utilities, such as fluids, power lines and sensor leads, among others, to the base 148 and the electrostatic chuck 150. The electrostatic chuck 150 includes at least one clamping electrode 152 for retaining the substrate W below showerhead assembly 128. The electrostatic chuck 150 is driven by a chucking power source 154 to develop an electrostatic force that holds the substrate W to the chuck surface, as is conventionally known. Alternatively, the substrate W may be retained to the substrate support pedestal assembly 120 by clamping, vacuum or gravity.

At least one of the base 148 or electrostatic chuck 150 may include at least one optional embedded heater 156, at least one optional embedded isolator 158, and a plurality of conduits 160, 162 to control the lateral temperature profile of the substrate support pedestal assembly 120. The conduits 160, 162 are fluidly coupled to a fluid source 164 that circulates a temperature regulating fluid therethrough. The heater 156 is regulated by a power source 166. The conduits 160, 162 and heater 156 are utilized to control the temperature of the base 148, thereby heating and/or cooling the electrostatic chuck 150 and ultimately, the temperature profile of the substrate W disposed thereon. The temperature of the electrostatic chuck 150 and the base 148 may be monitored using a plurality of temperature sensors 168, 170. The electrostatic chuck 150 may further have a plurality of gas passages (not shown), such as grooves, that are formed in a substrate support pedestal supporting surface of the electrostatic chuck 150 and fluidly coupled to a source of a heat transfer (or backside) gas, such as helium (He). In operation, the backside gas is provided at controlled pressure into the gas passages to enhance the heat transfer between the electrostatic chuck 150 and the substrate W.

In one implementation, the substrate support pedestal assembly 120 is configured as a cathode and includes the electrode 152 that is coupled to a plurality of RF bias power sources 172, 174. The RF bias power sources 172, 174 are coupled between the electrode 152 disposed in the substrate support pedestal assembly 120 and another electrode, such as the showerhead assembly 128 or ceiling (lid 104) of the chamber body 102. The RF bias power excites and sustains a plasma discharge formed from the gases disposed in the processing region of the chamber body 102.

In the example depicted in FIG. 1, the dual RF bias power sources 172, 174 are coupled to the electrode 152 disposed in the substrate support pedestal assembly 120 through a matching circuit 176. The signal generated by the RF bias power sources 172, 174 is delivered through the matching circuit 176 to the substrate support pedestal assembly 120 through a single feed to ionize the gas mixture provided in the ICP etch chamber 100, thereby providing ion energy necessary for performing a deposition or other plasma enhanced process. The RF bias power sources 172, 174 are generally capable of producing an RF signal having a frequency of from about 50 kHz to about 200 MHz and a power between about 0 Watts and about 5000 Watts. An additional bias power source 178 may be coupled to the electrode 152 to control the characteristics of the plasma.

In one mode of operation, the substrate W is disposed on the substrate support pedestal assembly 120 in the ICP etch chamber 100. A process gas and/or gas mixture is introduced into the chamber body 102 through the showerhead assembly 128 from the gas panel 122. The vacuum pump system 114 maintains the pressure inside the chamber body 102 while removing deposition by-products.

A controller 180 is coupled to the ICP etch chamber 100 to control operation of the ICP etch chamber 100. The controller 180 includes a central processing unit (CPU) 182, a memory 184, and a support circuit 186 utilized to control the process sequence and regulate the gas flows from the gas panel 122. The CPU 182 may be any form of general purpose computer processor that may be used in an industrial setting. The software routines can be stored in the memory 184, such as random access memory, read only memory, floppy, or hard disk drive, or other form of digital storage. The support circuit 256 is conventionally coupled to the CPU 182 and may include cache, clock circuits, input/output systems, power supplies, and the like. Bi-directional communications between the controller 180 and the various components of the ICP etch chamber 100 are handled through numerous signal cables.

Figure 2:
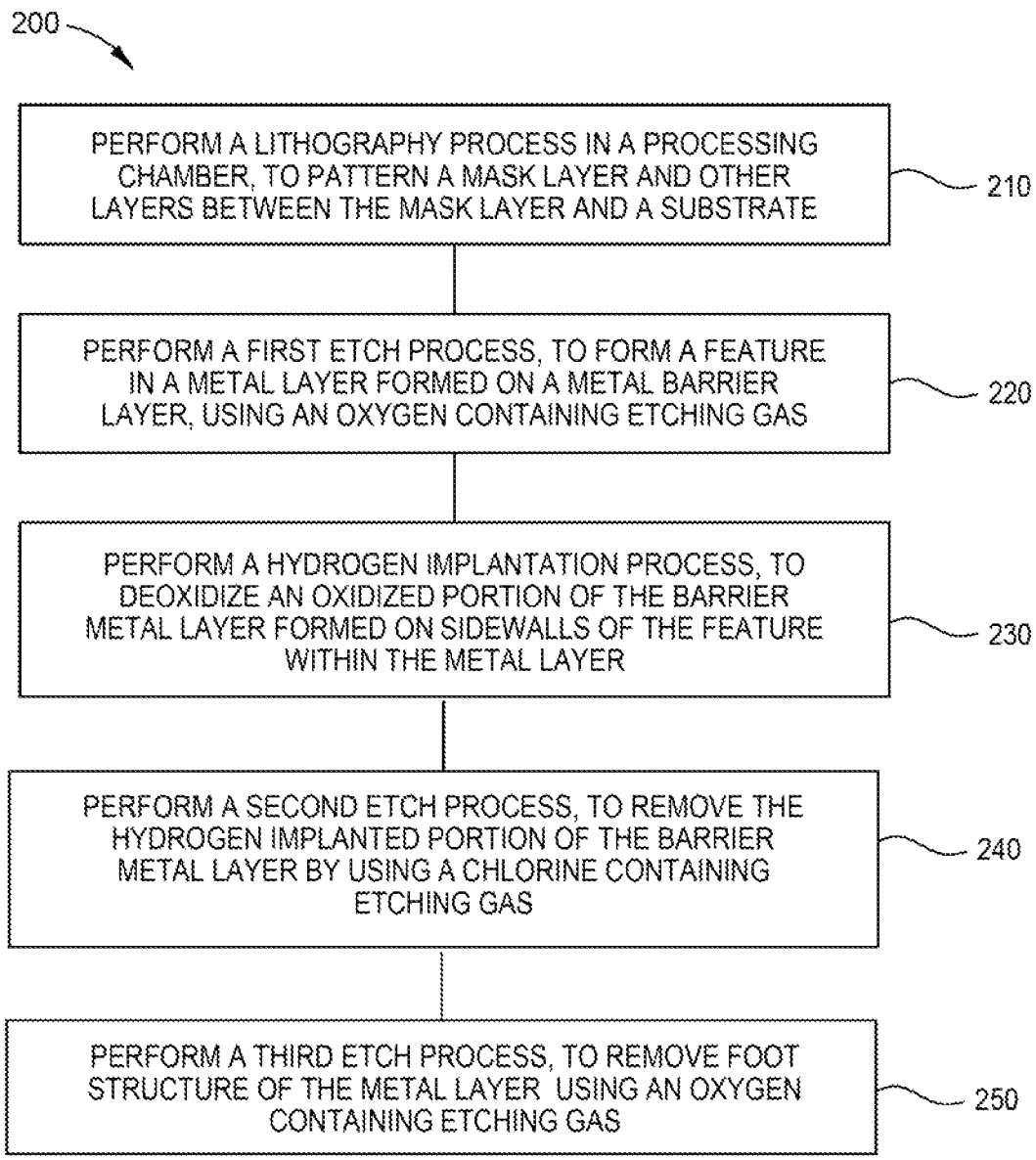
FIG. 2 illustrates a flowchart of a method of patterning a film stack according to one embodiment.

FIG. 2 illustrates a flowchart of a method 200 of patterning a film stack 300 by photolithography and etch processes according to one embodiment. FIGS. 3A-3F illustrate cross-sectional view of a portion of the film stack 300 at various stages of the method 200. Although the method 200 and FIGS. 3A-3F are discussed in the context of patterning a high aspect ratio (HAR) metal feature formed on a substrate with a barrier metal between the metal feature and the substrate, which may be used in dynamic random-access memory (DRAM), flash memory, and logic devices, the method 200 can be used to etch other metal features formed on other types of substrates.

Figure 3A:
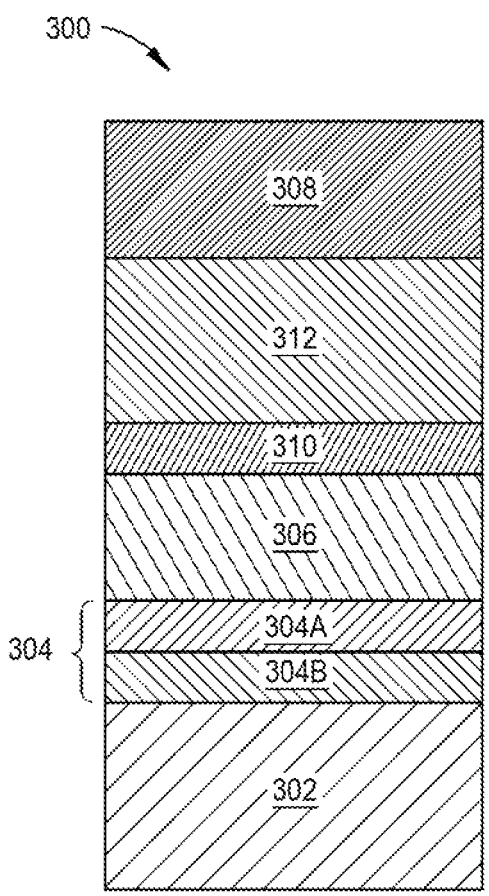
FIGS. 3A, 3B, 3C, 3D, 3E, and 3F are cross-sectional views of a portion of a film stack according to one embodiment.

Referring to FIG. 3A, the film stack 300 that undergoes photolithography and etch processes includes a substrate 302, a barrier metal layer 304, a metal layer 306, and a mask layer 308. The film stack 300 may include additional layers between the metal layer 306 and the mask layer 308. There may be a cap layer 310 formed over the metal layer 306 to protect the metal layer 306 from proceeding lithography processes. In DRAM applications, a dielectric layer, such as a silicon nitride ($Si_3N_4$) layer, 312 may be formed between the cap layer 310 and the mask layer 308. In one example, the metal layer 306, and the dielectric layer 312 may be patterned to form a metal feature and a dielectric feature, and used as bit lines and storage trench capacitors, respectively, in a DRAM device.

The substrate 302 may include a material such as doped or undoped polycrystalline silicon, silicon oxide, doped or undoped silicon wafers and patterned or non-patterned wafers, crystalline silicon (e.g., Si<100> or Si<111>), strained silicon, silicon germanium, silicon on insulator (SOI), carbon doped silicon oxides, silicon nitride, doped silicon, germanium, gallium arsenide, glass, or sapphire. The substrate 302 may have various dimensions, such as 200 mm, 300 mm, 450 mm, or other diameter wafers, as well as, rectangular or square panels.

The metal layer 306 includes a noble metal such as ruthenium (Ru), iridium (Ir), platinum (Pt), or rhodium (Rd), that can be etched using oxygen containing etching gas.

Between the substrate 302 and the metal layer 306, the barrier metal layer 304 is disposed to prevent diffusion of metal species, such as ruthenium (Ru), from the metal layer 306 into the substrate 302, which may result in metal silicate, such as ruthenium silicate. The barrier metal layer 304 may include a titanium (Ti) layer 304A and a titanium nitride (TiN) layer 304B. In some embodiments, the barrier metal layer 304 includes a tantalum (Ta) layer 304A and a tantalum nitride (TaN) layer 304B.

The mask layer 308 may include a pad oxide layer, an amorphous carbon layer (ACL), or a silicon oxynitride (SiON) layer. The mask layer 308 may be formed using any appropriate deposition process, such as spin-on coating, chemical vapor deposition (CVD), or the like.

Figure 3B:
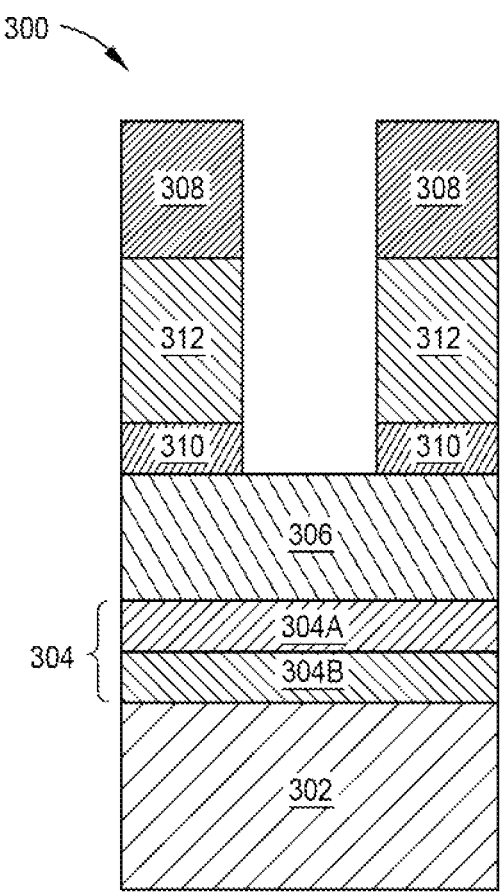

The method 200 begins with block 210 in which a lithography process is performed, as shown in FIG. 3B. In the lithography process in block 210, the mask layer 308 and other layers between the mask layer 308 and the cap layer 310, e.g., the dielectric layer 312 in the example shown in FIG. 3A, are patterned using a patterned photoresist layer (not shown) formed on the mask layer 308. To pattern features with linewidths and line CD smaller than can be achieved by conventional lithography in the sub 7 nm node semiconductor processes, a double patterning with a spacer layer (not shown) formed on the mask layer 308 may be performed. The mask layer 308 may be removed after the lithography process in block 210.

Figure 3C:
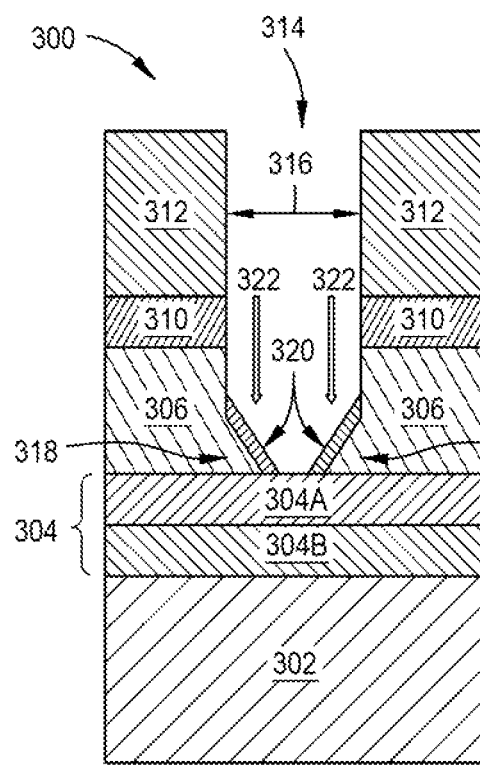

In block 220, a first etch process is performed to etch the metal layer 306 to form a feature, such as a trench 314, having a line CD 316, as shown in FIG. 3C. The overburden etch process can be any appropriate etch process, such as a dry plasma etch process in an ICP etch chamber, such as the ICP etch chamber 100. The dry plasma etch process in block 220 is performed by simultaneously supplying an oxygen containing etching gas, and inert gas, such as argon (Ar), nitrogen ($N_2$), or helium (He), in the ICP etch chamber. A halogen containing gas may be also supplied to enhance an etch rate of the metal layer 306. Suitable examples of the oxygen containing etching gas include $O_2$, $O_3$, $H_2O$, $H_2O_2$, $N_2O$, $NO_2$. Suitable examples of the halogen containing gas includes $Cl_2$, HCl, HF, $F_2$, $Br_2$, HCl, HBr, $SF_6$, and $NF_3$. In one particular example, the oxygen containing etching gas includes oxygen ($O_2$), the inert gas includes argon (Ar) and nitrogen ($N_2$), and the halogen containing gas includes chorine ($Cl_2$).

During the dry plasma etch process in block 220, several process parameters may be regulated. In one example, oxygen ($O_2$) gas may be supplied at flow rate of between about 10 sccm and about 1000 sccm, for example, about 100 sccm. Argon (Ar) gas may be supplied at a flow rate of between about 0 sccm and about 1000 sccm, for example, about 150 sccm. Nitrogen ($N_2$) gas may be supplied at a flow rate of between about 0 sccm and about 100 sccm, for example, about 10 sccm. Chorine ($Cl_2$) gas may be supplied at a flow rate of between about 10 sccm and about 500 sccm, for example, about 30 sccm. The dry plasma etch process is performed for a duration of between about 5 second and about 60 seconds, for example, about 10 seconds. In one exemplary embodiment, a process pressure in the ICP etch chamber is regulated between about 3 mTorr and about 50 mTorr, for example, about 20 mTorr. Temperature of a substrate support disposed within the ICP etch chamber, such as the substrate support pedestal assembly 120, is maintained between about 0 degrees Celsius and about 100 degrees Celsius, for example, about 50 degrees Celsius.

The source RF power can be maintained at between about 600 W and about 2000 W, for example, about 1500 W. A low RF bias power is applied to ions formed from the oxygen and the halogen containing gas mixture to bombard the film stack 300 with low energy. In one example, the bias RF power is maintained at between about 50 W and about 400 W, for example, about 200 W.

In some implementations, a purge operation can be performed after the first etch process in block 220. In a purge operation, non-surface bound oxygen and chlorine species are removed from the process chamber. The species generated in an oxygen and chlorine based plasma can be removed by stopping the plasma and allowing the remaining species to decay, optionally combined with purging and/or evacuation of the chamber. Purge operation can be done using any inert gas such as $N_2$, Ar, Ne, He, or a combination thereof.

Due to an etch resistance of the barrier metal layer 304 to the oxygen containing etching gas used in the first etch process in block 220 for etching the metal layer 306, the barrier metal layer 304 remains undamaged. However, a portion of the barrier metal layer 304 is oxidized and sputtered onto an un-etched portion 318 of the metal layer 306 near a top surface of the barrier metal layer 304, forming an oxidized portion 320 of the barrier metal layer 304. This oxidized portion 320 is formed of titanium oxide ($TiO_2$) in the embodiments having the barrier metal layer 304 of a titanium (Ti) layer 304A and a titanium nitride (TiN) layer 304B, and tantalum oxide ($TaO_2$) in the embodiment having the barrier metal layer 304 of a tantalum (Ta) layer 304A and a tantalum nitride (TaN) layer 304B. The oxidized portion of the barrier metal layer 305 acts as an etch stop layer that prevents further etching the metal layer 306 to a top surface of the barrier metal layer 304, leaving the un-etched portion 318 (also referred to as "foot structure") within the trench 314 near the bottom top surface of the barrier metal layer 304. A thickness of the oxidized portion 320 of the barrier metal layer 304 may be between 0.5 nm and about 5 nm, for example, about 2 nm, corresponding to between about 1 monolayers and about 10 monolayers of the metal oxide (i.e., titanium oxide or tantalum oxide). In one example, a linewidth of the etched metal layer 306 and the etched dielectric layer 312 is between about 5 nm and about 12 nm, for example, about 8 nm, and the foot structure 318 can be as wide as between about 2 nm and about 12 nm, for example, about 4.5 nm, in each side of the trench 314, and thus the un-etched portion 318 has a width of between about 7 nm and 18 nm.

Figure 3D:
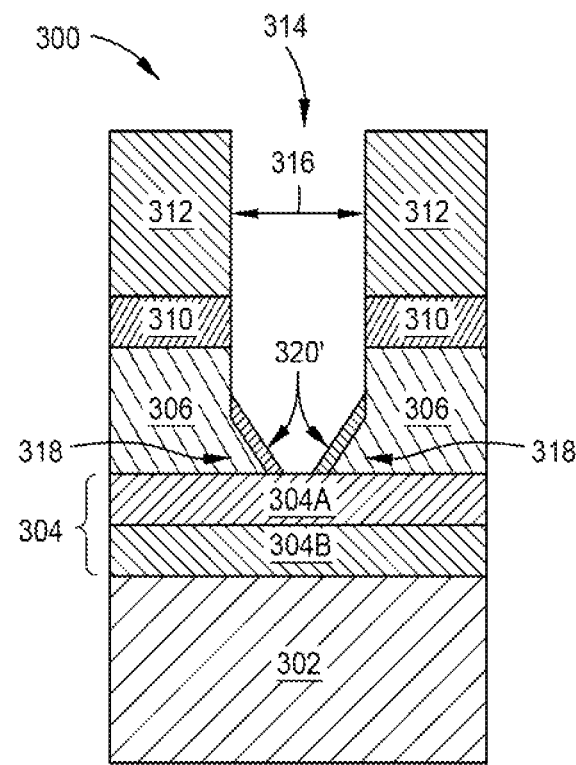

In block 230, a hydrogen ($H_2$) implantation process is performed to chemically reduce (i.e., reverse the oxidation of) the oxidized portion 320 of the barrier metal layer 304. The hydrogen implantation process in block 230 is performed by supplying a hydrogen containing gas in an ICP etch chamber, such as the ICP etch chamber 100. In some embodiments, the oxidized portion 320 of the barrier metal layer 304 is bombarded with plasma effluents 322 generated from the hydrogen containing gas and directed towards the oxidized portion 320 of the barrier metal layer 304, providing directional energy transfer to facilitate hydrogen implantation of the oxidized portion 320 of the barrier metal layer 304 selectively to remaining portions of the film stack 300. The oxidized portion 320 of the barrier metal layer 304 chemically reacts with hydrogen ($H_2$), releasing water ($H_2O$), and reduces back to the original metal in a hydrogen implanted portion 320' of the barrier metal layer 304, as shown in FIG. 3D. For example, the oxidized portion 320 formed of titanium oxide ($TiO_2$) reduces back to titanium (Ti). The oxidized portion 320 formed of tantalum oxide ($TaO_2$) reduces back to tantalum (Ta). This chemical reducing process is a self-limiting chemical modification process that affects only on the outermost atomic layer of the oxidized portion 320, and, combined with the following etching step in block 240, allows removal of individual atomic layers (referred to as an atomic layer etching (ALE)) of the oxidized portion 320 of the barrier metal layer 304.

During the hydrogen implantation process in block 230, several process parameters may be regulated. In one example, hydrogen ($H_2$) gas may be supplied at flow rate of between about 50 sccm and about 500 sccm, for example, about 200 sccm. The hydrogen implantation process is performed for a duration of between about 5 second and about 40 seconds, for example, about 10 seconds. In one exemplary embodiment, a process pressure in the ICP etch chamber is regulated between about 3 mTorr and about 50 mTorr, for example, about 10 mTorr. Temperature of a substrate support disposed within the ICP etch chamber, such as the substrate support pedestal assembly 120, is maintained between about 0 degrees Celsius and about 80 degrees Celsius, for example, about 40 degrees Celsius.

The source RF power can be maintained at between about 300 W and about 1000 W, for example, about 500 W. The bias RF power is maintained at between about 0 W and about 300 W, for example, about 100 W, to provide the directionality of ion flux towards the oxidized portion 320 of the barrier metal layer 304.

In some implementations, a purge operation can be performed after the hydrogen implantation process in block 230 to remove non-surface bound hydrogen species and water ($H_2O$) are removed from the process chamber. Purging operation can be done using any inert gas such as $N_2$, Ar, Ne, He, or a combination thereof.

Figure 3E:
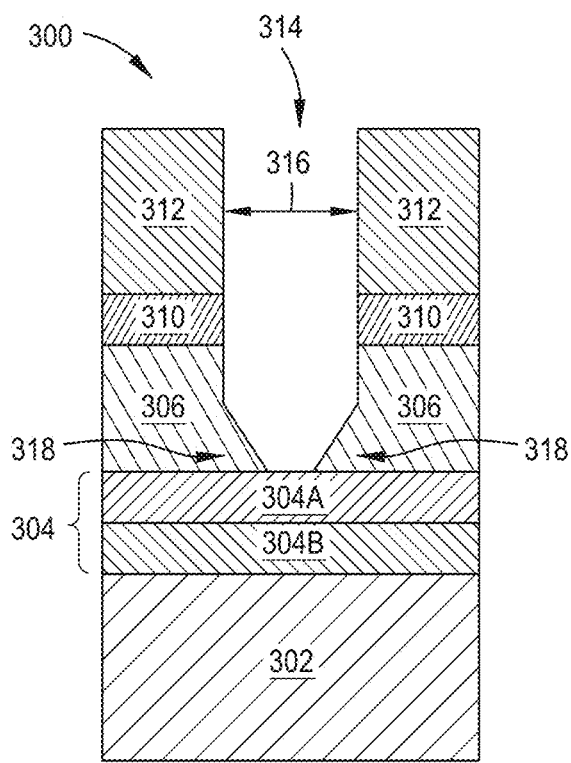
Figure 3F:
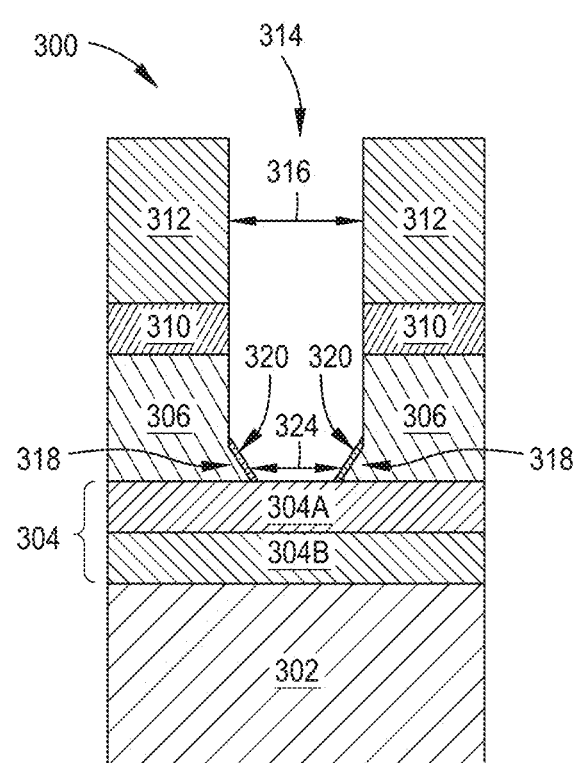

In block 240, a second etch process is performed to etch the hydrogen implanted portion 320' that has been chemically reduced, as shown in FIG. 3E. The second etch process, following the hydrogen implantation process in block 230, completes the ALE process. This etch process can be any appropriate etch process, such as a dry plasma etch process in an ICP etch chamber, such as the ICP etch chamber 100. The hydrogen implanted portion 320' includes titanium (Ti) in the embodiments having the barrier metal layer 304 of a titanium (Ti) layer 304A and a titanium nitride (TiN) layer 304B. The hydrogen implanted portion 320' include tantalum (Ta) in the embodiments having the barrier metal layer 304 of a tantalum (Ta) layer 304A and a tantalum nitride (TaN) layer 304B. The dry plasma etch process in block 240 is performed by simultaneously supplying a chlorine containing gas, and inert gas, such as argon (Ar), nitrogen ($N_2$), or helium (He), in the ICP etch chamber. A carbon containing gas may be also supplied as a catalyst for the etching of the barrier metal layer 304 of a titanium (Ti) layer 304A and a titanium nitride (TiN) layer 304B to $TiCl_4$. Suitable examples of the chlorine containing gas include $Cl_2$, HCl, $CCl_4$, $CHCl_3$, $CH_2Cl_2$, $CH_3Cl$, and the like. Suitable examples of the carbon containing gas include methane ($CH_4$), ethane ($C_2H_6$), and ethylene ($C_2H_4$). In one particular example, the chlorine containing gas includes $Cl_2$, the inert gas includes argon (Ar), and the carbon containing gas includes $CH_4$.

During the dry plasma etch process in block 240, several process parameters may be regulated. In one example, chlorine ($Cl_2$) gas may be supplied at flow rate of between about 30 sccm and about 500 sccm, for example, about 420 sccm. Argon (Ar) gas may be supplied at a flow rate of between about 0 sccm and about 400 sccm, for example, about 200 sccm. Methane ($CH_4$) gas may be supplied at a flow rate of between about 10 sccm and about 50 sccm, for example, about 15 sccm. The dry plasma etch process is performed for a duration of between about 10 second and about 60 seconds, for example, about 30 seconds. In one exemplary embodiment, a process pressure in the ICP etch chamber is regulated between about 5 mTorr and about 30 mTorr, for example, about 20 mTorr. Temperature of a substrate support disposed within the ICP etch chamber, such as the substrate support pedestal assembly 120, is maintained between about 0 degrees Celsius and about 80 degrees Celsius, for example, about 40 degrees Celsius.

The source RF power can be maintained at between about 300 W and about 1500 W, for example, about 500 W. A low RF bias power is applied to ions formed from the chlorine and the carbon containing gas mixture to bombard the film stack 300 with low energy. In one example, the bias RF power is maintained at between about 0 W and about 100 W, for example, about 0 W.

In some implementations, a purge can be performed after the second etch process in block 240 to remove non-surface bound chlorine species and methane are removed from the process chamber. Purging can be done using any inert gas such as $N_2$, Ar, Ne, He, or a combination thereof.

In block 250, a third etch process is performed to remove the foot structure 318 of the metal layer 306 after the hydrogen implanted portion 320' is removed in block 240. The third process in block 250 is the same as the first etch process in block 220. In some embodiments, the third etch process in block 250 is different from the first etch process in block 220. For example, the third etch process in block 250 performed for a shorter duration than the first etch process in block 220.

The processes in blocks 230-250 are repeated until the foot structure 318 of the metal layer 306 is removed substantially, achieving the trench 314 having a desired opening (also referred to as a "foot CD") 324 at a bottom of the trench 314. A desired foot CD 324 may be narrower than the line CD 316 of the trench 314 by no more than about 1 nm. For example, the foot CD 324 can be increased by between about 3 nm and about 4 nm and the width of the foot structure 318 of the metal layer 306 can be reduced to between about 0.5 nm and about 4.5 nm, by repeating the processes in blocks 230-250 for about 5 cycles.

In the embodiments described herein, methods for forming metal features in semiconductor structure are provided. The methods described herein can be used to form a metal structure that can by etched by oxygen containing etching gas and is formed on a barrier metal layer that cannot be etched by the oxygen containing etching gas. A portion of the barrier metal layer that is oxidized by the oxygen containing etching gas is first chemically reduced by hydrogen implantation and then removed by chlorine containing etching gas. Thus, the metal structure can be etched to have a desired line CD without being interrupted by the oxidized portion of the barrier layer.

While the foregoing is directed to embodiments of the present disclosure, other and further embodiments of the disclosure may be devised without departing from the basic scope thereof, and the scope thereof is determined by the claims that follow.

What is claimed is:

1. A method for selective barrier metal etching, the method comprising:
   performing a hydrogen implantation process to chemically reduce an oxidized portion of a barrier metal layer on a foot structure formed at a bottom of a feature in a metal layer on the barrier metal layer;
   performing a first etch process to remove the hydrogen implanted portion of the barrier metal layer; and
   performing a second etch process to remove at least a portion of the foot structure,
   wherein the hydrogen implantation process, the first etch process, and the second etch process are repeated.

2. The method of claim 1, wherein the metal layer comprises ruthenium.

3. The method of claim 1, wherein the barrier metal layer comprises a first layer comprising titanium and a second layer comprising titanium nitride.

4. The method of claim 1, wherein the barrier metal layer comprises a first layer comprising tantalum and a second layer comprising tantalum nitride.

5. The method of claim 1, wherein the hydrogen implantation process comprises directing plasma effluents generated from a hydrogen containing gas towards the oxidized portion of the barrier metal layer.

6. The method of claim 1, wherein the first etch process comprises supplying a chlorine containing gas, an inert gas, and a carbon containing gas.

7. The method of claim 1, wherein the hydrogen implantation process, the first etch process, and the second etch process are performed in an inductively coupled plasma (ICP) etch chamber, and the first etch process remove an outermost atomic layer of the hydrogen implanted portion of the barrier metal layer.

8. A method for forming a metal containing feature, the method comprising:
   performing a first etch process to form a feature in a metal layer formed on a barrier metal layer, using an oxygen containing etching gas, wherein after the first etch process, the feature has an un-etched portion of the metal layer near a top surface of the barrier metal layer within the feature;
   performing a hydrogen implantation process to chemically reduce an oxidized portion of the metal barrier layer formed within the feature in the metal layer; and
   performing a second etch process to remove the hydrogen implanted portion of the barrier metal layer using a chlorine containing etching gas; and performing a third etch process to remove at least a portion of the un-etched portion of the metal layer using the oxygen containing etching gas, wherein the hydrogen implantation process, the second etch process, and the third etch process are repeated until the un-etched portion of the metal layer is removed substantially.

9. The method of claim 8, wherein the metal layer comprises ruthenium.

10. The method of claim 8, wherein the barrier metal layer comprises a first layer comprising titanium and a second layer comprising titanium nitride.

11. The method of claim 8, wherein the barrier metal layer comprises a first layer comprising tantalum and a second layer comprising tantalum nitride.

12. The method of claim 8, wherein the hydrogen implantation process comprises directing plasma effluents generated from a hydrogen containing gas towards the oxidized portion of the barrier metal layer.

13. The method of claim 8, wherein:
the first etch process, the hydrogen implantation process, and the second etch process are performed in an inductively coupled plasma (ICP) etch chamber, and
the hydrogen implantation process and the second etch process remove an outermost atomic layer of the hydrogen implanted portion of the barrier metal layer.

14. The method of claim 8, wherein the oxidized portion of the barrier metal layer formed within the feature in the metal layer has a thickness of between 0.5 nm and 5 nm.

15. The method of claim 13, further comprising:
wherein the first etch process and the third etch process are different.

* * * * *